United States Patent [19]

Yokota et al.

[11] Patent Number: 5,067,989

[45] Date of Patent: Nov. 26, 1991

[54] SINGLE CRYSTAL SILICON

[75] Inventors: Shuji Yokota; Hirotoshi Yamagishi, both of Annaka, Japan

[73] Assignee: Shin Etsu Handotai Co., Ltd., Tokyo, Japan

[21] Appl. No.: 570,680

[22] Filed: Aug. 22, 1990

[30] Foreign Application Priority Data

Aug. 23, 1989 [JP] Japan ................................. 1-216569

[51] Int. Cl.$^5$ ............................................. H01L 29/36
[52] U.S. Cl. .................................... 148/33; 148/33.2; 156/605
[58] Field of Search ................. 148/32.2, 24; 156/605; 437/101; 252/62.3 E

[56] References Cited

FOREIGN PATENT DOCUMENTS 3150539 6/1983 Fed. Rep. of Germany.
3910449 1/1990 Fed. Rep. of Germany.
60-55629 3/1985 Japan ................................. 148/24

OTHER PUBLICATIONS

Journal of Electrochem. Soc., vol. 119, No. 2, Feb. 1972, New York, U.S.; D. I. Pomerantz: "Effects of Grown-In and Process-Induced Defects in Single Crystal Silicon".
Journal of Electrochem. Soc., vol. 119, No. 9, Sep. 1972, pp. 1241–1243, New York, U.S.; A. J. R. De Kock et al.: "A New Method for Revealing Striations in High-Resistive Floating-Zone Silicon Crystals".
Rep. Prog. Phys., vol. 45, No. 10, Oct. 1982, pp. 1183–1186, Berlin, DE, R. C. Newman: "Defects in Silicon".

*Primary Examiner*—Olik Chaudhuri
*Assistant Examiner*—Long Pham
*Attorney, Agent, or Firm*—Armstrong, Nikaido, Marmelstein, Kubovcik & Murray

[57] ABSTRACT

Single crystal silicon for a substrate of semiconductor integrated circuits is disclosed. Cu, Fe, Ni and Cr are contained as impurities in a concentration smaller than 0.1 ppta, respectively, and the total content of the impurities is less than 0.4 ppta. Oxygen-induced stacking faults are reduced to an absolute minimum.

4 Claims, No Drawings

SINGLE CRYSTAL SILICON

BACKGROUND OF THE INVENTION

1. Field of the Invention

The present invention relates to single crystal silicon typically for use as a substrate of semiconductor integrated circuits. More particularly, the invention is directed to such single crystal silicon in which contamination with certain specific impurities is minimized in the bulk of the substrate so that stacking faults induced on main or front surfaces during thermal oxidation are reduced substantially to zero.

2. Description of the Prior Art

Thermal oxidation is commonly accepted as a requisite of processing integrated circuits, particularly those of an MOS type. Oxygen-induced stacking faults referred to simply as OSF which have developed while the single crystal silicon is treated at elevated temperature, are found to significantly contribute to the electrical characteristics of the integrated circuit to be formed. OSF, therefore, has heretofore been a great concern in the electronics industry.

OSF are generally known to grow in an oxidative atmosphere and to reduce under a non-oxidative condition. This type of fault is reportedly attributable to (a) mechanical strains induced during wafer fabrication, (b) point defects developed and accumulated in heat processing, (c) defects due to ion implantation, (d) surface contaminations with Na, and (e) surface defects such as so-called swirl defects and bulk defects originating from dissolved oxygen deposition.

The surface and bulk defects among those factors are closely associated with various IG treatments effected initially in the production of integrated circuits from silicon wafers. The IG treatments are effective to prevent the wafer from getting involved in OSF as they are capable of rendering the wafer fully free from oxygen-induced minute defects at the active surface layer. It has been further proposed, as taught for instance by Japanese Patent Laid-open Publication No. 55-56098, that oxygen-induced bulk defects in the bulk of single crystal silicon can be prohibited by controlling the thermal history of single crystal silicon during the period of time when the latter material is being pulled by the Czochralski method. This prior process is intended to subject a rod of single crystal silicon, just following the whole growth process to a temperature in the region of 900° to 500° C. in the furnace chamber for not longer than 4 hours and thereafter cooling such rod at a cooling speed of not lower than 100° C. per hour.

The surface and bulk defects would also be expected to result from contamination with metallic impurities. To this end, many attempts have been made to examine and detect those contaminants introduced in single crystal silicon, as disclosed in the following publications. However, none of them make a detailed analysis of the correlation between the individual metals and the OSF levels.

1. P. F. Schmit et al, "Solid-state Science and Technology", J. Electrochem. Soc., p.632 (1981)
2. Nakajima and Ohara, "Chemical Analyses of Semiconductors", Ohyô Butsuri, Vol. 43, No. 5, p.438 (1974)
3. Nakajima, Bando and Nakayama, "Neutron Activation Analyses of Impurities in Highly Pure Silicon Semiconductors", Bunseki Kiki, Vol. 6, No. 9, p572 (1968)
4. Shirai, "Pulling Technology of Single Crystal Silicons", Zairyo Gijutsu, Vol. 2, No. 1, p.41 (1984)

Neutron activation analysis allows a limited group of metals such as Au to be detected in the order of ppta but fails to measure various other metals up to such level of concentration.

Under the above state of technologies, there has been left unsolved the technical problem of holding OSF a substantially nil level in single crystal silicon.

SUMMARY OF THE INVENTION

The present invention seeks to provide single crystal silicon for use as a substrate of semiconductor integrated circuits which exhibits lesser susceptibility to OSF on a semiconducting substrate and has an OSF density of not more than 10 or 100/cm$^2$, respectively, for an n-type, (100)-orientation semiconducting substrate.

The single crystal silicon according to the present invention, because of its minimum generation of OSF, is favorably applicable to the production of various semiconductor devices of superior electrical characteristics.

According to one aspect of the invention, there is provided single crystal silicon for use as a substrate of semiconductor integrated circuits having n-type conductivity with the polished (100) orientation front surface, comprising as impurities Cu, Fe, Ni and Cr in an individual concentration of not more than 0.1 ppta and in a total content of not more than 0.4 ppta, whereby the silicon has minimized generation of oxygen-induced stacking faults.

According to another aspect of the invention, there is provided single crystal silicon for use as a substrate of semiconductor integrated circuits having n-type conductivity with the polished (100) orientation front surface, comprising as impurities Cu, Fe, Ni, Cr, Ti and Mn in an individual concentration of not more than 0.1 ppta and in a total content of not more than 0.6 ppta, whereby the silicon has minimized generation of oxygen-induced stacking faults.

DETAILED DESCRIPTION OF THE INVENTION

Single crystal silicon according to the present invention is suitable for the production of various semiconductor devices of superior electrical characteristics. A first form of single crystal silicon contemplated under the invention comprises metallic contaminants in which are included Cu, Fe, Ni and Cr. Each of the contaminants should not be greater than 0.1 ppta in concentration, whereas all these contaminants should be smaller than 0.4 ppta in total content. By strict observance of these requirements, the OSF density is maintained at below 100/cm$^2$ as an n-type semiconductor substrate (100)-oriented and mirror-polished.

A second form of silicon is so structured as to have an OSF density of less than 10/cm$^2$. In such instance, metallic impurities are Cu, Fe, Ni, Cr, Ti and Mn, respectively, in a concentration of not more than 0.1 ppta and, on the whole, in a content of not more than 0.6 ppta. To attain OSF densities up to 100/cm$^2$, Ti and Mn if excessively present are not likely to involve anything adverse.

A certain method of analysis has previously been developed by the present inventor so as to detect metallic contaminants introduced in single crystal silicon during the pulling stage by the Czochralski (CZ) method. This analysis method is conspicuously superior in accuracy to conventional counterparts, as described in Japanese Patent Application No. 1-82840. Impurities, i.e. Cu, Fe, Ni, Cr, Ti and Mn, are determinable with the limits of detection in the order of 0.01 ppta; that is, a residual melt in a quartz crucible is examined at a solidification ratio of single crystal silicon grown in the CZ method in which polycrystalline silicon is molten with heat in the crucible, followed by immersion into the melt and pull of seed crystal therefrom and by subsequently continuous growth of single crystal rod. The invention is based upon the finding that there are correlations between the contents of individual impurities in a single crystal pulled and the densities of OSF on the substrate processed therefrom which were made clear by taking advantage of such high accuracy analysis.

Several publications disclose, only in part, that metal contamination causes OSF generation in single crystal silicon resulting from crystal growth by the pulling method. The silicon thus grown is known to lead to nucleation of minute defects due chiefly to the defects of lattice and to the presence of dissolved oxygen. This latter oxygen when in a super-saturated state develops minute defects and, when carbon is dissolved those defects increase over the level which will be encountered without dissolved carbon. It is to be recognized in the art that nucleation of minute defects will be caused also by metallic contaminants for reasons noted in connection with the behavior of oxygen.

It has now been found that OSF densities can be selectively reduced to $100/cm^2$ and to $10/cm^2$, respectively, by the limitation of selected metals to specified concentrations and contents.

The invention will be further described by way of the following examples which should be construed as illustrative rather than restrictive.

Examples 1 to 6 and Comparative Examples 1 to 4

Into a quarts crucible of 45 cm in diameter was charged 60 kg of polycrystalline silicon which was thereafter doped with phosphorus and molten with heat. An n-type, (100)-orientation, 155-cm diameter rod of single crystal silicon was pulled from the melt.

Impurity concentration in the single crystal silicon was quantitated by determining the concentrations of the various impurities in the crucible residue. The silicon melt was solidified, after pulling of the single crystal silicon, to the residue of about 100 g. The resulting residue melt was fully solidified by cooling, followed by comminution and cleaning on the surface and by subsequent dissolution in an aqueous mixture of hydrofluoric acid an nitric acid. Measurement of impurity concentrations was then made in accordance with ICP from which the concentrations of contaminants in the single crystal silicon were converted by the following equation.

$$C = C_O k(1-X)^{k-1}$$

where
C: impurity concentration in single crystal silicon,
$C_O$: impurity concentration in initial charge,
k: diffusion coefficient, and
X: solidification ratio.

As the parameter k, a value is used which is reported in W. Zulenhner et al, "Silicon Chemical Etching", Crystal, Vol. 8, p.28. In general, heavy metal contaminants have extremely small values of k, about $10^{-6}$, and hence contaminants are likely to remain, in almost all amounts, in the residual melt without appreciable inclusion in silicon crystals. It is therefore sufficient to analyze the residual melt in determining the initial concentrations of contaminants as $C_O$. The ratio of solidification is zero at an initial stage. This is taken to mean that the foregoing equation may be rearranged to $C = C_O \cdot k$. More specifically, the impurity concentration in single crystal silicon is defined as [impurity concentration in residual melt × silicon weight of residual melt (100 g)/crystalline silicon weight (60 kg)] × k.

The results obtained are shown in Table 1 along with the quantitative lower limits. Metals contained in the melt have been proved to be primarily Cu, Fe, Ni, Cr, Ti and Mn. Table 2 represents the quantitative lower limits of those six metals in single crystal silicon.

TABLE 1

| Element | Concentration (ppma) | Lower limit (ppma) | Element | Concentration (ppma) | Lower limit (ppma) |
|---|---|---|---|---|---|
| Hf | <0.02 | 0.02 | Mg | <0.01 | 0.01 |
| Ta | <0.1 | 0.1 | Al | 2.0 | 0.01 |
| W | <0.1 | 0.1 | Ca | <0.1 | 0.1 |
| Re | <0.1 | 0.1 | Sc | <0.01 | 0.01 |
| Os | <0.1 | 0.1 | Ti | 0.6 | 0.03 |
| Ir | <0.07 | 0.07 | V | <0.1 | 0.1 |
| Pt | <0.03 | 0.03 | Cr | 4 | 0.002 |
| Au | <0.03 | 0.03 | Mn | 1.5 | 0.001 |
| Hs | <0.2 | 0.2 | Fe | 9 | 0.007 |
| Tl | <0.3 | 0.3 | Co | <0.01 | 0.01 |
| Pb | <0.4 | 0.4 | Ni | 3.6 | 0.02 |
| Bi | <0.3 | 0.3 | Cu | 0.5 | 0.03 |
| Be | <0.03 | 0.03 | Zn | <0.01 | 0.01 |
| Ga | <0.03 | 0.03 | Cd | <0.02 | 0.02 |
| Ge | 0.4 | | In | <0.08 | 0.08 |
| As | <0.05 | 0.05 | Sn | <0.4 | 0.4 |
| Se | <0.5 | 0.5 | Sb | <0.1 | 0.1 |
| Sr | <0.01 | 0.01 | Te | <0.3 | 0.3 |
| Y | <0.003 | 0.003 | Ba | <0.01 | 0.01 |
| Zr | <0.01 | 0.01 | La | <0.01 | 0.01 |
| Nb | <0.1 | 0.1 | Ce | <0.1 | 0.1 |
| Mo | <0.02 | 0.02 | Pr | <0.1 | 0.1 |
| Ru | <0.03 | 0.03 | Nd | <0.03 | 0.03 |
| Rh | <0.05 | 0.05 | Sm | <0.05 | 0.05 |
| Pd | <0.07 | 0.07 | Eu | <0.01 | 0.01 |
| Ag | <0.01 | 0.01 | Gd | <0.03 | 0.03 |
| Tb | <0.07 | 0.07 | Tm | <0.05 | 0.05 |
| Dy | <0.02 | 0.02 | Yb | <0.02 | 0.02 |
| Ho | <0.02 | 0.02 | Lu | <0.01 | 0.01 |
| Er | <0.02 | 0.02 | | | |

TABLE 2

| Element | Lower limit (ppta) |
|---|---|
| Ti | 0.0005 |
| Cr | 0.0001 |
| Mn | 0.00002 |
| Fe | 0.0001 |
| Ni | 0.001 |
| Cu | 0.02 |

Different single crystal silicon rods were prepared to have varied concentrations of the primary metals as shown in Table 3. On pulling at an overall length of 110 cm, each of the test silicon rods was sliced at an interval of 10 cm to wafers of 0.075 mm in thickness each for each. Mirror polishing, steam oxidation at 1,150° C. in a furnace, cooling to room temperature and removal of oxide film with aqueous hydrofluoric acid solution from the sample surface were done in that order. After etching by immersion into a selective etching solution for 2 minutes, the developed OSF density on the etched surface was examined by means of an optical microscope.

Cu, Fe, Ni and Cr when reduced to the specified contents prevent OSF development as evidenced by Table 3. Ti and Mo have turned out, even with increased contents, not to invite increased OSF.

TABLE 3

| Impurity concentration (ppta) | Examples | | | |
|---|---|---|---|---|
| | 1 | 2 | 3 | 4 |
| Cu | 0.1 | 0.05 | 0.05 | 0.05 |
| Fe | 0.05 | 0.12 | 0.05 | 0.05 |
| Ni | 0.05 | 0.05 | 0.06 | 0.05 |
| Cr | 0.05 | 0.05 | 0.05 | 0.1 |
| Ti | 0.3 | 0.3 | 0.3 | 0.3 |
| Mn | 0.2 | 0.2 | 0.2 | 0.2 |
| OSF density (pieces/cm$^2$) | 80 | 50 | 75 | 50 |

Controls, comparative Examples 1 to 4, were prepared as shown in Table 4 and treated as in Examples 1 to 4.

Either one of Cu, Fe, Ni and Cr when exceeding the specified amounts reveals a sharp rise in OSF.

TABLE 4

| Impurity concentration (ppta) | Comparative Examples | | | |
|---|---|---|---|---|
| | 1 | 2 | 3 | 4 |
| Cu | 0.2 | 0.05 | 0.05 | 0.05 |
| Fe | 0.05 | 0.2 | 0.05 | 0.05 |
| Ni | 0.05 | 0.05 | 0.1 | 0.05 |
| Cr | 0.05 | 0.05 | 0.05 | 0.2 |
| Ti | 0.3 | 0.3 | 0.3 | 0.3 |
| Mn | 0.2 | 0.2 | 0.2 | 0.2 |
| OSF density (pieces/cm$^2$) | 400 | 300 | 300 | 250 |

As has been confirmed from Table 5, Ti and Mn when set within the specified amounts, together with Cu, Fe, Ni and Cr, OSF is significantly reduced. This is particularly true of Example 6 in which all these metals are present at 0.05 ppta. OSF is nil.

TABLE 5

| Impurity concentration (ppta) | Examples | |
|---|---|---|
| | 5 | 6 |
| Cu | 0.05 | 0.05 |
| Fe | 0.05 | 0.05 |
| Ni | 0.05 | 0.05 |
| Cr | 0.05 | 0.05 |
| Ti | 0.14 | 0.05 |
| Mn | 0.1 | 0.05 |
| OSF density (pieces/cm$^2$) | 20 | 0 |

What is claimed is:

1. Single crystal silicon for use as a substrate of semiconductor integrated circuits, comprising as impurities Cu, Fe, Ni and Cr in individual concentrations, respectively, of not more than 0.1 ppta and in a total content of not more than 0.4 ppta, whereby the silicon reduced oxygen-induced stacking faults.

2. Single crystal silicon for use as a substrate of semiconductor integrated circuits, comprising as impurities Cu, Fe, Ni, Cr, Ti and Mn in individual concentrations, respectively of not more than 0.1 ppta and in a total content of not more than 0.6 ppta, whereby the silicon has reduced oxygen-induced stacking faults.

3. The single crystal silicon as claimed in claims 1 or 2 containing not more than 100 OSF sites per cm$^2$.

4. The single crystal silicon as claimed in claims 1 or 2 containing not more than 10 OSF sites per cm$^2$.

* * * * *